(12) United States Patent
Tran

(10) Patent No.: US 7,184,800 B2
(45) Date of Patent: Feb. 27, 2007

(54) PRINTED STUBBY UNBALANCED DIPOLE ANTENNA

(75) Inventor: Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 730 days.

(21) Appl. No.: 10/271,608

(22) Filed: Oct. 15, 2002

(65) Prior Publication Data

US 2004/0072599 A1   Apr. 15, 2004

(51) Int. Cl.
*H04M 1/00* (2006.01)

(52) U.S. Cl. .................. 455/575.1; 455/575.5

(58) Field of Classification Search ............... 455/13.3, 455/19, 25, 63.4, 82, 83, 562.1, 575.5, 575.7, 455/97, 107, 121, 129, 193.1, 269, 550.1, 455/553.1, 90.1, 90.3; 343/793, 754, 817, 343/818, 821, 860, 700 MS
See application file for complete search history.

(56) References Cited

U.S. PATENT DOCUMENTS 5,936,587 A * 8/1999 Gudilev et al. ............. 343/752

| | | | |
|---|---|---|---|
| 6,417,816 B2* | 7/2002 | Sadler et al. | 343/795 |
| 6,582,887 B2* | 6/2003 | Luch | 430/311 |
| 2001/0024163 A1* | 9/2001 | Petite | 340/628 |
| 2003/0160727 A1* | 8/2003 | Ebine et al. | 343/702 |
| 2004/0145529 A1* | 7/2004 | Iguhci et al. | 342/702 |
| 2005/0190115 A1* | 9/2005 | Chiang et al. | 343/833 |
| 2005/0212706 A1* | 9/2005 | Ying et al. | 343/702 |

* cited by examiner

*Primary Examiner*—Quochien B. Vuong
*Assistant Examiner*—Dominic E. Rego

(57) ABSTRACT

A printed circuit board unbalanced dipole antenna is provided for a wireless communications telephone. Digital and/or transceiver circuits are mounted on a wireless telephone circuit board. In addition, a radiator is formed from a printed conductive line overlying the circuit board dielectric layer, with an end for connection to a transmission line and an unterminated end. To shorten the overall length of the antenna, the radiator is formed in a series of rectangular or zig-zag meanders with a plurality of first sections with a first orientation and a plurality of second sections with a second orientation, orthogonal, or approximately orthogonal to the first orientation. In some aspects, the radiator first sections overlie the dielectric layer first side and the radiator second sections overlie the dielectric layer second side. Then, the radiator first and second sections are connected with a plurality of vias.

20 Claims, 3 Drawing Sheets

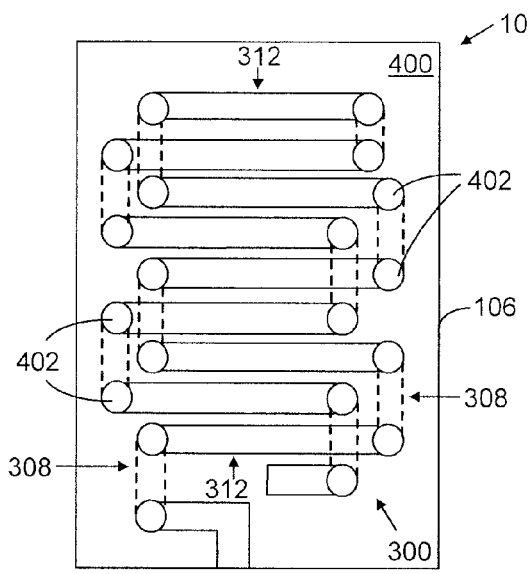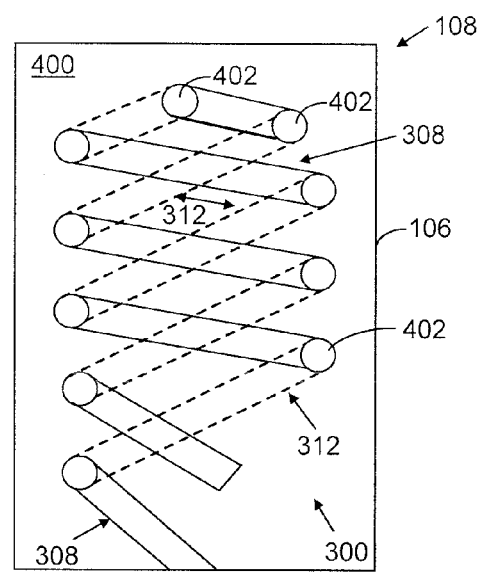
FIG. 5A  FIG. 5B
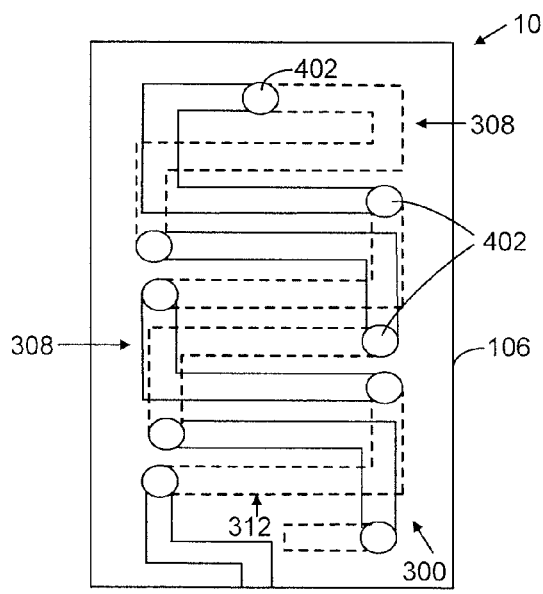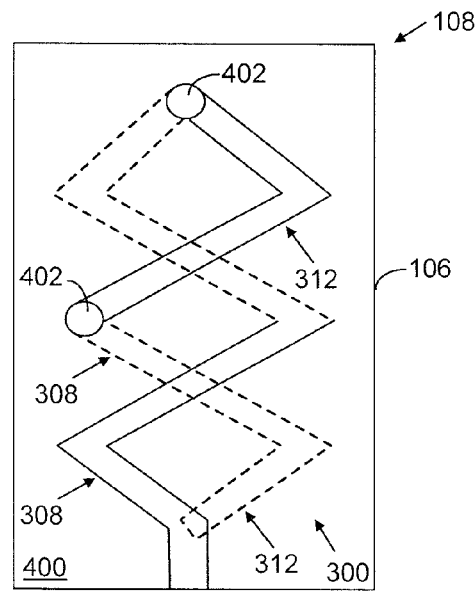
FIG. 6A  FIG. 6B

PRINTED STUBBY UNBALANCED DIPOLE ANTENNA

BACKGROUND OF THE INVENTION

1. Field of the Invention

This invention generally relates to wireless communication antennas and, more particularly, to an unbalanced dipole antenna that is formed on a printed circuit board of a wireless communications telephone.

2. Description of the Related Art

The size of portable wireless communications devices, such as telephones, continues to shrink, even as more functionality is added. As a result, the designers must increase the performance of components or device subsystems while reducing their size, or placing these components in less desirable locations. One such critical component is the wireless communications antenna. This antenna may be connected to a telephone transceiver, for example, or a global positioning system (GPS) receiver.

Wireless communications devices, a wireless telephone or laptop computer with a wireless transponder for example, are known to use simple cylindrical coil antennas as either the primary or secondary communication antennas. The resonance frequency of the antenna is responsive to its electrical length, which forms a portion of the operating frequency wavelength. The electrical length of a wireless device helical antenna is often an odd multiple of a quarter-wavelength, such as $3\lambda/4$, $5\lambda/4$, or $\lambda/4$, where $\lambda$ is the wavelength of the operating frequency, and the effective wavelength is responsive to the dielectric constant of the proximate dielectric.

Wireless telephones can operate in a number of different frequency bands. In the US, the cellular band (AMPS), at around 850 megahertz (MHz), and the PCS (Personal Communication System) band, at around 1900 MHz, are used. Other frequency bands include the PCN (Personal Communication Network) at approximately 1800 MHz, the GSM system (Groupe Speciale Mobile) at approximately 900 MHz, and the JDC (Japanese Digital Cellular) at approximately 800 and 1500 MHz. Other bands of interest are global positioning satellite (GPS) signals at approximately 1575 MHz and Bluetooth at approximately 2400 MHz.

Typically, better communication results are achieved using a whip antenna, as opposed to the above-mentioned helical antennas. Using a wireless telephone as an example, it is typical to use a combination of a helical and a whip antenna. In the standby mode with the whip antenna withdrawn, the wireless device uses the stubby, lower gain helical coil to maintain control channel communications. When a traffic channel is initiated (the phone rings), the user has the option of extending the higher gain whip antenna. Some devices combine the helical and whip antennas. Other devices disconnect the helical antenna when the whip antenna is extended.

The whip antenna has a physical length, when extended, related to the antenna operating frequency. When withdrawn, the whip antenna must fit within the constraints of the wireless device chassis. Therefore, as the wireless device chassis decreases in size, the extended length of conventional whip antennas has necessarily decreased. A shorter whip antenna can be made to operate at the same frequency as longer whip antennas by using higher dielectric constant materials in the antenna fabrication. However, the use of higher dielectric constants makes for a lower gain antenna, and a poorer performing wireless device.

One popular solution to the above-mentioned length problem has been to fabricate the whip antenna as a wire with a telescoping tube section. When the antenna is withdrawn, the wire section is withdrawn into the tube, with the tube being withdrawn into the chassis. When extended, the combination of the wire and tube section defines the antenna length.

Many wireless telephones that are noted for their small size still have a whip antenna portion extending from the chassis body, even in the withdrawn position. This extending portion can become tangled in a trouser pocket or purse as the user extracts the phone to answer a call. One solution to this problem is to wear a belt-mounted holster to carry the phone, or to mount a belt clip on the phone. However, this solution at least partially defeats the purpose of making the phone small enough to be pocketsize.

It is known to use a portion of a circuit board, such as a dc power bus, as an electromagnetic radiator. This solution eliminates the problem of an antenna extending from the chassis body. However, these radiators are extremely inefficient "antennas", typically providing poor gain and directionality. These types of radiators are also susceptible to crosstalk from other signals on the board. Further, these types of radiators can also propagate signals that interfere with digital or radio frequency (RF) on the circuit board. Electromagnetic communications through these radiators can also be shielded by other circuits, circuit groundplanes, the chassis, or other circuit boards in the chassis.

It would be advantageous if an efficient antenna could be developed that did not extend out from the chassis body of a wireless phone, as a typical whip antenna does in the withdrawn position.

It would be advantageous if a wireless telephone chassis could be made with minimal extending portions, such as the extending portions resulting from the housing of antennas.

It would be advantageous if an efficient antenna could be formed on a wireless telephone circuit board.

SUMMARY OF THE INVENTION

The present invention describes a stubby dipole antenna that is printed on a circuit board. More specifically, the antenna can be formed on a wireless telephone circuit board that includes digital or RF circuitry. The formation of the antenna of the circuit board reduces the chassis body form factor by eliminating, or at least reducing, any extensions in the body associated with the antenna.

Accordingly, a printed circuit board unbalanced dipole antenna is provided for a wireless communications telephone. The antenna comprises a circuit board dielectric layer. Typically, there are digital and/or transceiver circuits mounted in the circuit board. In addition, a radiator is formed from a printed conductive line overlying the circuit board dielectric layer with a first end for connection to a transmission line and a second, unterminated end. To shorten the overall length of the antenna, the radiator is formed in a series of rectangular or zig-zag meanders with a plurality of first sections with a first orientation and a plurality of second sections with a second orientation, orthogonal to, or approximately orthogonal to the first orientation.

In some aspects, the radiator includes sections overlying the dielectric layer first side connected to sections on the dielectric layer second side through a via. In another aspect, the radiator first sections overlie the dielectric layer first side and the radiator second sections overlie the dielectric layer second side. Then, the radiator first and second sections are connected with a plurality of vias.

Additional details of the above described dipole antenna are described below.

BRIEF DESCRIPTION OF THE DRAWINGS

FIGS. 5a and 5b are plan views illustrating a two-sided circuit aspect of the antenna of FIG. 1 with side-alternating first and second radiator sections.

FIGS. 6a and 6b are plan views illustrating a two-sided circuit aspect of the antenna of FIG. 1 with side-alternating first and second radiator section combinations.

DETAILED DESCRIPTION OF THE PREFERRED EMBODIMENTS

Figure 1:
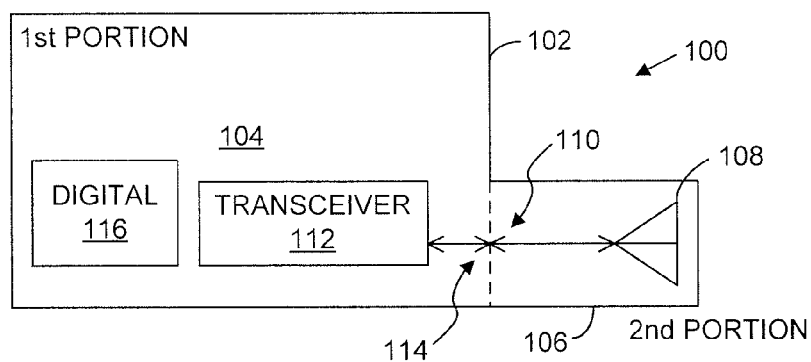
FIG. 1 is a schematic block diagram of the present invention wireless communications telephone system.

FIG. 1 is a schematic block diagram of the present invention wireless communications telephone system. The system 100 comprises a circuit board 102 including a first portion 104 and a second portion 106. An antenna 108 is printed on the second portion 106 of the circuit board 102, having a transmission line interface 110.

Figure 2:
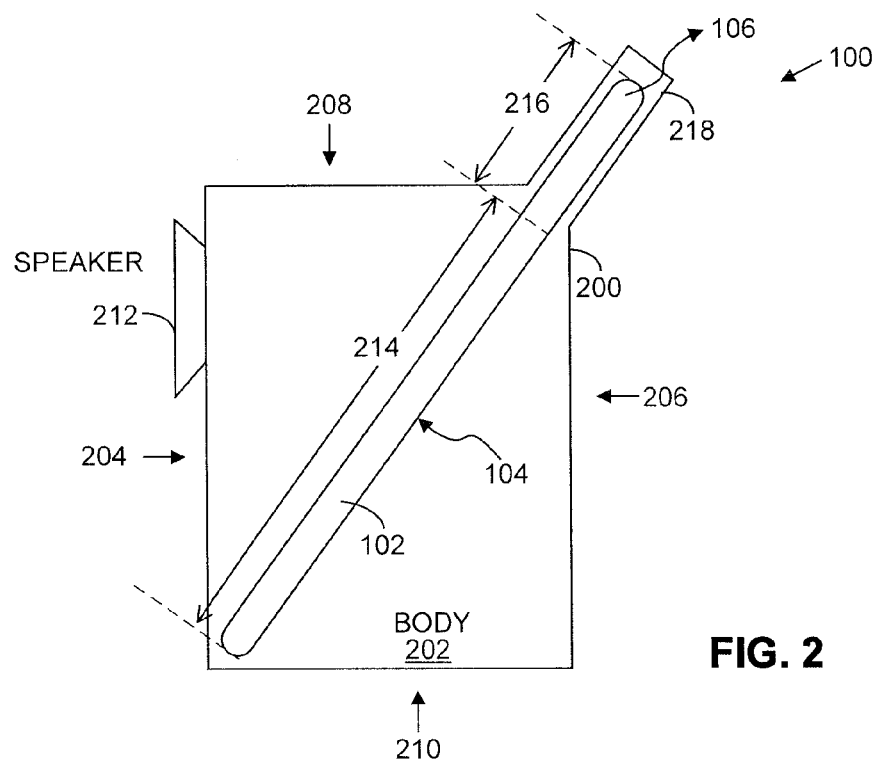
FIG. 2 is a partial cross-sectional profile view of the system of FIG. 1.

FIG. 2 is a partial cross-sectional profile view of the system 100 of FIG. 1. The system 100 further comprises a chassis 200 with a body 202. The body 202 is understood to be the main or substantial portion of the phone. For example, the body of a rectangular or brick-shaped phone is the rectangle. For a flip-phone, the body is the two clamshell halves when the phone is opened, or the substantially rectangular shape when the phone is closed. As shown, the body 202 is rectangular. The first portion 104 of the circuit board is substantially encompassed by the chassis body 202. The second portion 106 of the circuit board extends outside the chassis body 202. Alternately but not shown, the second portion 106 can be encompassed by the body 202. The improved form factor comes at the expense of degraded antenna performance however, as the antenna is partially shielded.

The chassis body 202 has a first side 204, a second side 206, a top end 208, and a bottom end 210. The system 100 further comprises a speaker 212 mounted to chassis body first side 204 proximate to the top end 208. The circuit board first portion 104 has a length 214 extending from the chassis body first side 204 bottom end 210, to the second side 206 top end 208. The circuit board second portion 106 has a length 216 extending through the chassis top end 208 proximate to the second side 206. As shown, the chassis 200 includes an extended portion 218 to encompass the circuit board second section 106.

The circuit board 102 is angled so that the antenna is positioned away from the user's head during use. The user's head (ear) is likely to be next to the speaker 212. The position of the user's head proximate to the antenna can interfere with antenna performance. The angled circuit board alleviates this concern.

Returning to FIG. 1, in some aspects a transceiver circuit 112 is mounted on the first portion 104 of the circuit board with an antenna port 114 connected to the antenna transmission line interface 110. The transceiver circuit 112 includes receiver and transmitter circuitry such as amplifiers, filters, oscillators, and mixers. In other aspects, digital circuitry 116 can also be mounted on the first portion 104 of the circuit board. Not shown, the first portion 104 of the circuit board can also include power supply circuitry, display circuitry, and/or a keypad. It should be understood that the present invention antenna is able to provide high performance without the necessity of being formed on a separate, single purpose antenna circuit board. Substantial cost savings can be realized by combining telephone circuits on a single circuit board. Alternately but not shown, the system may include two or more circuit boards to reduce the overall form factor of the telephone, with the antenna mounted on one of the circuit boards that also includes transceiver, digital, or power supply circuitry.

Figure 3A:
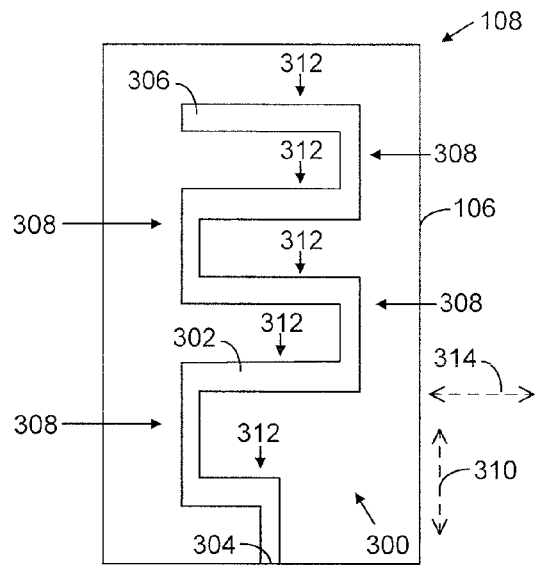
FIGS. 3a and 3b are plan view details of the antenna of FIG. 1.
Figure 3B:
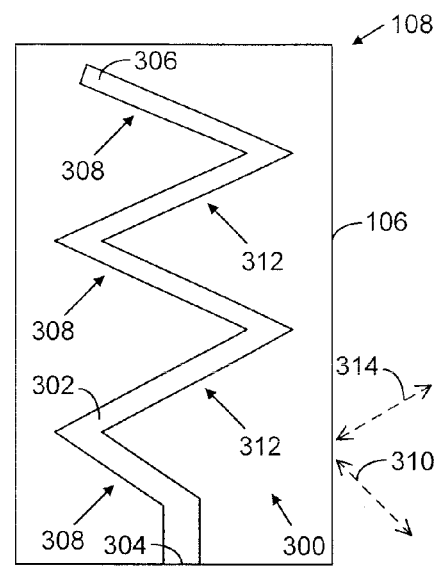

FIGS. 3a and 3b are plan view details of the antenna 108 of FIG. 1. The antenna 108 is an unbalanced dipole antenna. Considering either FIG. 3a or 3b, the antenna 108 includes a radiator 300 formed from a printed conductive line 302 overlying the circuit board second portion dielectric layer with a first end 304 for connection to a transmission line and a second, unterminated end 306. The lines can be formed from an etching process that selectively removes portions of a metal cladding overlying the circuit board. Alternately, the conductive lines can be formed through a metal deposition process.

Typically, the antenna radiator 300 has an effective electrical length of approximately a quarter-wavelength odd multiple at the operating frequency. That is, a wavelength of $(2n+1)(\lambda/4)$, where $n=0, 1, 2, \ldots$ . The length of the radiator is a combination of the various meandering sections considered in light of the dielectric constant of the circuit board dielectric layer, as is well known in the art. In other aspects, the antenna 108 can be different length than a quarter-wavelength odd multiple. Such a situation may occur, for example, when the antenna is expected to operate over a wide bandwidth or multiple bandwidths.

The antenna radiator 300 includes a plurality of first sections 308 with a first orientation 310 and a plurality of second sections 312 oriented with a second orientation 314, that can be orthogonal, or approximately orthogonal to the first orientation 310. When the first and section sections 308/312 are orthogonal, coupling between the sections can be minimized, permitting the antenna to be made "stubby" without substantially degrading the antenna performance. The sections can also be oriented so that they are not orthogonal, further reducing the form factor of the antenna at the expense of performance, which is degraded by increased coupling between radiator first and second sections.

As shown in FIG. 3a, the antenna radiator 300 is formed in a pattern of meandering rectangular lines. As shown in FIG. 3b, the antenna radiator 300 is shown in a pattern of meandering zig-zag lines. The invention can be enabled with other patterns or shapes, FIGS. 3a and 3b are merely exemplary.

Figure 4A:
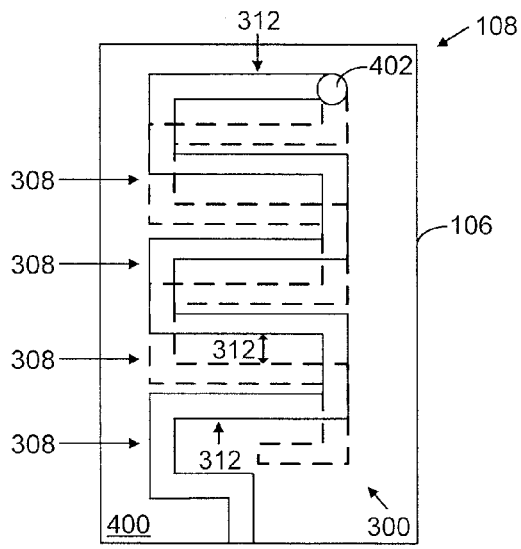
FIGS. 4a and 4b are plan views illustrating a two-sided circuit board aspect of the antenna of FIG. 1.
Figure 4B:
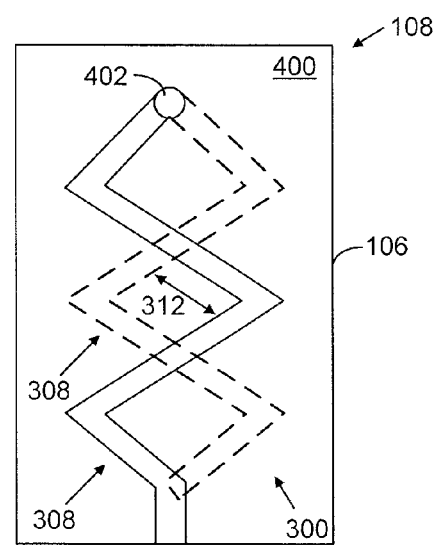

FIGS. 4a and 4b are plan views illustrating a two-sided circuit board aspect of the antenna 108 of FIG. 1. The circuit board second portion 106 dielectric layer has a first side 400 that can be seen and a second, opposite side that cannot be seen in the figures. Further, at least one connection via 402 exists between the dielectric layer first side 400 and the dielectric layer second side. The vias can be formed through a process that drills holes through the dielectric and plates the holes with a conductive material. Alternately, the vias can be any means that pass through the dielectric layer to electrically connect to the first and second sides. The antenna radiator 300 includes sections overlying the dielectric layer first side 400 connected to sections on the dielectric layer second side through the via 402. The overall size of the antenna 108 can be reduced by printing the radiator on both sides of the circuit board.

As shown in FIG. 4a, the antenna radiator 300 is formed from a meandering rectangular line overlying the dielectric layer first side 400, and connected through the via 402 to a meandering rectangular line overlying the dielectric layer second side (represented as a dotted line). As shown, the first sections 308 on the circuit board second side minimally underlie first section 308 on the first side 400, while simultaneously, the second sections 312 on the circuit board second side minimally underlie second sections 312 on the first side 400. However, other arrangements are possible. For example (not shown), the first sections 308 of the circuit board second side may underlie the first sections 308 on the circuit board first side 400. Likewise, the radiator second sections 312 on the circuit board second side can underlie the second sections 312 on the circuit board first side 400.

As shown in FIG. 4b, the antenna radiator 300 is formed from a meandering zig-zag line overlying the dielectric layer first side 400, and connected through the via 402 to a meandering zig-zag line overlying the dielectric layer second side (represented as a dotted line). As shown, the first sections 308 minimally underlie first section 308 on the first side 400, while simultaneously, the second sections 312 on the circuit board second side minimally underlie second sections 312 on the first side 400. Alternately but not shown, the first sections 308 of the circuit board second side may underlie the first sections 308 on the circuit board first side 400. As another alternate (not shown), the second sections 312 of the circuit board second side may underlie the second sections 312 on the circuit board first side 400.

Both figures represent the radiator length to be approximately evenly divided between the dielectric layer first and second sides. However, the lengths need not necessarily be equal. The invention can be enabled with other patterns or shapes, FIGS. 4a and 4b are merely exemplary.

FIGS. 5a and 5b are plan views illustrating a two-sided circuit aspect of the antenna 108 of FIG. 1 with side-alternating first and second radiator sections 308/312. The antenna radiator first sections 308 overlie the dielectric layer first side 400 and the radiator second sections 312 overlie the dielectric layer second side. The antenna radiator first and second sections 308/312 are connected with a plurality of vias 402. While not always as space efficient as the antennas of FIGS. 4a and 4b, the antennas of FIGS. 5a and 5b promote decoupling between the first and second sections 308/312 by forming them on opposite sides of the circuit board. In some aspects, as shown in FIG. 5b, this increased decoupling permits the first and second sections to be aligned non-orthogonally, to reduce the form factor while minimally impacting the antenna performance.

As shown in FIG. 5a, the antenna radiator first sections 308 and second sections 312 (represented as dotted lines) form a meandering rectangular line. As shown in FIG. 5b, the antenna radiator first sections 308 and second sections (represented as dotted lines) form a meandering zig-zag line.

Both figures represent the radiator length to be approximately evenly divided between the dielectric layer first and second sides. However, the lengths need not necessarily be equal. The invention can be enabled with other patterns or shapes, FIGS. 5a and 5b are merely exemplary.

FIGS. 6a and 6b are plan views illustrating a two-sided circuit aspect of the antenna 108 of FIG. 1 with side-alternating first and second radiator section combinations. As above, the radiator 300 includes sections overlying the dielectric layer first side connected to sections on the dielectric layer second side through a plurality of vias 402. More specifically, the radiator 300 includes a plurality of first and second section combinations overlying the dielectric layer first side and the radiator includes a plurality of first and second section combinations overlying the dielectric layer second side.

As shown, the combinations each include one first section and one second section, however, the invention is not limited to just this type of combination. The radiator combinations on the dielectric layer first side are connected to the radiator combinations on the dielectric layer second side (shown as dotted lines) with a plurality of vias 402.

In FIG. 6a, the antenna radiator first sections 308 and second section 312 combinations form a meandering rectangular line. As shown in FIG. 6b, the antenna radiator first sections 308 and second section combinations form a meandering zig-zag line.

Both figures represent the radiator length to be approximately evenly divided between the dielectric layer first and second sides. However, the lengths need not necessarily be equal. The invention can be enabled with other patterns or shapes, FIGS. 6a and 6b are merely exemplary.

A wireless telephone printed stubby unbalanced dipole antenna has been provided. Rectangular and zig-zag patterns have been provided as examples, however, the invention is not limited to merely these patterns. Likewise, examples were given for forming the antenna radiator on two sides of a circuit board. Again, other combinations are possible. The examples were also given using a consistent type of radiator patterning, either rectangular or zig-zag. However, the patterns need not be consistent. For example, a radiator can be formed form a combination of rectangular, zig-zag, or other non-depicted patterns. Although the antenna has been described in the context of a wireless telephone, it has broader application for use in other communication technologies. Other variations and embodiments of the present invention will occur to those skilled in the art.

I claim:

1. A wireless communications device comprising:
a circuit board including a first portion and a second portion, the second portion comprising a dielectric layer having a first side, a second side and a plurality of vias connecting the first side to the second side; and,
an antenna comprising a printed conductive line on the second portion of the circuit board, the antenna comprising:
a first radiator section overlying the first side of the dielectric layer; and
a second radiator section overlying the second side of the dielectric layer and electrically connected to the first radiator section by the plurality of vias,
a first end for connection to a transmission line; and
a second unterminated end.

2. The device system of claim 1 further comprising:
a chassis with a body;
wherein the first portion of the circuit board is substantially encompassed by the chassis body; and,
wherein the second portion of the circuit board extends outside the chassis body.

3. The device of claim 2 wherein the chassis body has a first side, a second side, a top end, and a bottom end;
wherein the circuit board first portion extends from the chassis body first side proximate to the bottom end to the second side proximate to the top end; and, wherein the circuit board second portion extends through the chassis top end proximate to the second side.

4. The device of claim 1 further comprising:
a transceiver mounted on the first portion of the circuit board, the transceiver having an antenna port.

5. The device of claim 1 further comprising:
digital circuitry mounted on the first portion of the circuit board.

6. The device of claim 5 further comprising:
a transceiver mounted on the first portion of the circuit board the transceiver having an antenna port.

7. The device of claim 1 wherein the antenna is an unbalanced dipole antenna.

8. The device of claim 1 wherein the radiator has an effective electrical length of approximately a quarter-wavelength odd multiple at the operating frequency.

9. The device of claim 1 wherein the radiator includes a plurality of orthogonal radiator sections.

10. The device of claim 1 wherein the radiator is formed in a pattern selected from the group including meandering rectangular lines and meandering zig-zag lines.

11. The device of claim 1 wherein the radiator is formed from a first meandering rectangular line overlying the dielectric layer first side, and connected through the plurality of vias to a second meandering rectangular line overlying the dielectric layer second side.

12. The device of claim 1 wherein the radiator is formed from a first meandering zig-zag line overlying the dielectric layer first side, and connected through the plurality of vias to a second meandering zig-zag line overlying the dielectric layer second side.

13. The device of claim 1 wherein the first radiator section and the second radiator section form a meandering rectangular line.

14. The device of claim 1 wherein the first radiator section and the second radiator section form a meandering zig-zag line.

15. An unbalanced dipole antenna for a wireless communications device, the antenna comprising:
a circuit board comprising a dielectric layer, the dielectric layer having a first side, a second side, and a plurality of connection vias between the dielectric layer first side and the dielectric layer second side;
a circuit mounted on the circuit board; and,
a radiator formed from a printed conductive line comprising:
a first section overlying the first side of the dielectric layer; and
a second section overlying the second side of the dielectric layer and connected to the first section through the plurality of connection vias;
a first end for connection to a transmission line; and
a second unterminated end.

16. The antenna of claim 15 wherein the radiator includes a plurality of orthogonal radiator sections.

17. The antenna of claim 15 wherein the radiator is formed in a pattern selected from the group including meandering rectangular lines and meandering zig-zag lines.

18. The antenna of claim 15 wherein the radiator is formed from a first meandering rectangular line overlying the dielectric layer first side, and connected through the plurality of connection vias to a second meandering rectangular line overlying the dielectric layer second side.

19. The antenna of claim 15 wherein the radiator is formed from a first meandering zig-zag line overlying the dielectric layer first side, and connected through the plurality of connection vias to a second meandering zig-zag line overlying the dielectric layer second side.

20. The antenna of claim 15 wherein the radiator has an effective electrical length of approximately a quarter-wavelength odd multiple at the operating frequency.

* * * * *

UNITED STATES PATENT AND TRADEMARK OFFICE
CERTIFICATE OF CORRECTION

PATENT NO. : 7,184,800 B2 Page 1 of 1
APPLICATION NO. : 10/271608
DATED : February 27, 2007
INVENTOR(S) : Allen Tran It is certified that error appears in the above-identified patent and that said Letters Patent is hereby corrected as shown below:

Column 6, line 57
Claim 2 should read:

-- 2. The device of claim 1 further comprising:
    a chassis with a body;
    wherein the first portion of the circuit board is substantially encompassed by the chassis body; and,
    wherein the second portion of the circuit board extends outside the chassis body. --

Signed and Sealed this

Nineteenth Day of June, 2007

JON W. DUDAS
*Director of the United States Patent and Trademark Office*